US008889442B2

(12) United States Patent
Cho et al.

(10) Patent No.: US 8,889,442 B2
(45) Date of Patent: Nov. 18, 2014

(54) FLEXIBLE SEMICONDUCTOR DEVICE AND METHOD OF MANUFACTURING THE SAME (71) Applicant: Samsung Electronics Co., Ltd., Suwon-si (KR)

(72) Inventors: Eun-hyoung Cho, Hwaseong-si (KR); Jun-hee Choi, Seongnam-si (KR); Jin-seung Sohn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/919,460

(22) Filed: Jun. 17, 2013

(65) Prior Publication Data
US 2014/0162406 A1 Jun. 12, 2014

(30) Foreign Application Priority Data

Dec. 7, 2012 (KR) ........................ 10-2012-0142239

(51) Int. Cl.
*H01L 21/00* (2006.01)
*H01L 21/30* (2006.01)
*H01L 21/46* (2006.01)
*H01L 21/56* (2006.01)
*H01L 29/40* (2006.01)

(52) U.S. Cl.
CPC ............ *H01L 21/568* (2013.01); *H01L 29/401* (2013.01)
USPC ............. 438/28; 438/106; 438/107; 438/110; 438/127; 438/34; 438/458

(58) Field of Classification Search
USPC ......... 438/26, 27, 28, 34, 106, 107, 110, 113, 438/126, 127, 458
See application file for complete search history.

(56) References Cited

U.S. PATENT DOCUMENTS

| 6,982,184 | B2 * | 1/2006 | Silverbrook | 438/51 |
| 7,163,925 | B1 | 1/2007 | Jin et al. | |
| 7,772,088 | B2 * | 8/2010 | Henley et al. | 438/458 |
| 7,915,085 | B2 * | 3/2011 | Leung et al. | 438/110 |
| 7,972,875 | B2 * | 7/2011 | Rogers et al. | 438/21 |
| 8,257,988 | B1 * | 9/2012 | Popa et al. | 438/29 |
| 8,551,818 | B2 * | 10/2013 | Tanaka | 438/118 |
| 2002/0082392 | A1 | 6/2002 | Beach et al. | |
| 2005/0233546 | A1 * | 10/2005 | Oohata et al. | 438/458 |
| 2006/0205180 | A1 * | 9/2006 | Henley et al. | 438/458 |

(Continued)

FOREIGN PATENT DOCUMENTS

JP 2001-524812 A 12/2001

OTHER PUBLICATIONS

Jun Hee Choi et al; "Nearly single-crystalline GaN light-emitting diodes on amorphous glass substrates"; Nature Photonics; Dec. 2011; vol. 5; pp. 763-769.

(Continued)

*Primary Examiner* — Mary Wilczewski
*Assistant Examiner* — Erik T Peterson
(74) *Attorney, Agent, or Firm* — Sughrue Mion, PLLC (57) ABSTRACT

Provided is a method of transferring semiconductor elements formed on a non-flexible substrate to a flexible substrate. Also, provided is a method of manufacturing a flexible semiconductor device based on the method of transferring semiconductor elements. A semiconductor element grown or formed on the substrate may be efficiently transferred to the resin layer while maintaining an arrangement of the semiconductor elements. Furthermore, the resin layer acts as a flexible substrate supporting the vertical semiconductor elements.

28 Claims, 6 Drawing Sheets

(56) References Cited

U.S. PATENT DOCUMENTS

| | | | |
|---|---|---|---|
| 2007/0032089 A1* | 2/2007 | Nuzzo et al. | 438/725 |
| 2008/0157235 A1* | 7/2008 | Rogers et al. | 257/415 |
| 2009/0294803 A1* | 12/2009 | Nuzzo et al. | 257/213 |
| 2010/0101700 A1* | 4/2010 | Liang et al. | 156/73.1 |
| 2010/0187002 A1* | 7/2010 | Lee et al. | 174/260 |
| 2010/0203308 A1* | 8/2010 | Mennig et al. | 428/220 |
| 2010/0237380 A1* | 9/2010 | Tanaka | 257/99 |
| 2010/0267216 A1* | 10/2010 | Shimomura et al. | 438/458 |
| 2010/0283069 A1* | 11/2010 | Rogers et al. | 257/98 |
| 2010/0317132 A1* | 12/2010 | Rogers et al. | 438/27 |
| 2011/0223188 A1 | 9/2011 | Langermann | |
| 2011/0266561 A1* | 11/2011 | Rogers et al. | 257/88 |

OTHER PUBLICATIONS

Sang-Il Park et al.; "Printed Assemblies of Inorganic Light-Emitting Diodes for Deformable and Semitransparent Displays"; Science; Aug. 21, 2009; vol. 325; pp. 977-981; 6 sheets.

* cited by examiner

FLEXIBLE SEMICONDUCTOR DEVICE AND METHOD OF MANUFACTURING THE SAME

CROSS-REFERENCE TO RELATED APPLICATION

This application claims the benefit of Korean Patent Application No. 10-2012-0142239, filed on Dec. 7, 2012, in the Korean Intellectual Property Office, the disclosure of which is incorporated herein in its entirety by reference.

BACKGROUND

1. Field

Methods and apparatuses consistent with exemplary embodiments relate to semiconductor devices and methods of manufacturing the semiconductor devices, and particularly to flexible semiconductor devices and methods of manufacturing the flexible semiconductor devices.

2. Description of the Related Art

An optoelectronic device using an optoelectronic property of a semiconductor device is one of various semiconductor devices. An optoelectronic device includes a device converting electrical energy into optical energy or a device converting optical energy into electrical energy. Examples of an optoelectronic device converting electrical energy into optical energy include a light-emitting diode (LED), a laser diode (LD), and a luminous device, or a light-emitting device. Examples of an optoelectronic device converting optical energy into electrical energy include a solar battery and a photovoltaic device such as a photodiode.

An optoelectronic device based on an inorganic semiconductor, more particularly, a nitride semiconductor, has various advantages such as high efficiency, high brightness, and a long lifespan. However, in order to manufacture a nitride semiconductor, a single crystal nitride layer needs to be epitaxially grown on a non-flexible substrate such as a sapphire substrate, a silicon substrate, or the like.

However, a non-flexible substrate makes a semiconductor device non-flexible. A non-flexible semiconductor device is difficult to transform and is disadvantageous in cost reduction and in manufacturing a semiconductor having a large surface. Accordingly, a flexible semiconductor device and a method of producing the flexible semiconductor device based on an inorganic semiconductor material are required.

SUMMARY

One or more exemplary embodiments may provide methods of transferring semiconductor elements formed on non-flexible substrates to flexible substrates.

One or more exemplary embodiments may provide methods of manufacturing flexible semiconductor devices based on the methods of transferring semiconductor elements.

Additional exemplary aspects will be set forth in part in the description which follows and, in part, will be apparent from the description, or may be learned by practice of the presented embodiments.

According to an aspect of an exemplary embodiment, there is provided a method of transferring semiconductor elements, the method including: forming the semiconductor elements vertically on a substrate; forming an inorganic insulating layer on a surface of the vertical semiconductor elements and attaching an OH group on a surface of the inorganic insulating layer; forming an amphipathic layer on the surface of the inorganic insulating layer; applying a polymerizable composition on top of the vertical semiconductor elements coated with the amphipathic layer; curing the applied polymerizable composition thereby converting the applied polymerizable composition into a resin layer such that the vertical semiconductor elements are embedded in the resin layer; separating the resin layer along with the vertical semiconductor elements from the substrate; and etching a portion of the resin layer such that an upper portion of the vertical semiconductor elements is exposed.

According to an aspect of another exemplary embodiment, there is provided a method of transferring semiconductor elements, the method including: forming the semiconductor elements vertically on a substrate; forming an inorganic insulating layer on a surface of the vertical semiconductor elements and attaching an OH group on a surface of the inorganic insulating layer; forming an amphipathic layer on the surface of the inorganic insulating layer; applying a polymerizable composition on top of the vertical semiconductor elements coated with the amphipathic layer; compressing a support layer on the applied polymerizable composition; curing the applied polymerizable composition thereby converting the applied polymerizable composition into a resin layer such that the vertical semiconductor elements are embedded in the resin layer; separating the support layer along with the resin layer and the vertical semiconductor elements from the substrate; removing the support layer; and etching a portion of the resin layer such that an upper portion of the vertical semiconductor elements is exposed.

According to an aspect of another exemplary embodiment, there is provided a method of manufacturing a flexible semiconductor element, the method including: preparing a flexible laminate comprising a resin layer; vertical semiconductor elements embedded in the resin layer, wherein an upper portion of the semiconductor elements is exposed above the resin layer, and a bottom portion of the semiconductor elements is exposed below the resin layer; and optionally, at least one of a mask layer, a buffer layer, and an underlayer located below the vertical semiconductor elements; forming an upper electrode electrically connected to the vertical semiconductor elements on an upper surface of the flexible laminate; and forming a bottom electrode electrically connected to the vertical semiconductor elements on a bottom surface of the flexible laminate.

One or more exemplary embodiments pay provide methods of transferring semiconductor devices formed on a non-flexible substrate to a flexible substrate.

One or more exemplary embodiments may provide methods of manufacturing flexible semiconductor devices based on the methods of transferring semiconductor devices.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Reference will now be made in detail to exemplary embodiments, which are illustrated in the accompanying drawings, wherein like reference numerals refer to like elements throughout. In this regard, the present embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, an exemplary embodiment of a method of transferring semiconductor elements will be described in detail with reference to FIGS. 1A to 1G. FIGS. 1A to 1G are cross-sectional views illustrating an exemplary embodiment of a method of transferring semiconductor elements.

Figure 1A:
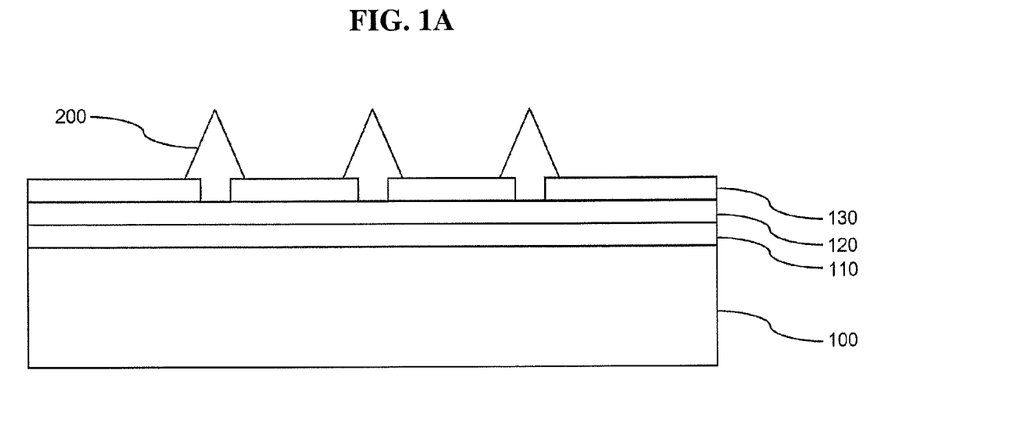
FIGS. 1A to 1G are cross-sectional views illustrating an exemplary embodiment of a method of transferring semiconductor elements.

FIG. 1A illustrates vertical semiconductor elements 200 on a substrate 100. The substrate 100 may be a crystalline or a non-crystalline substrate. For example, the substrate 100 may be a crystalline substrate such as a sapphire substrate and a silicon substrate. On the other hand, the substrate 100 may be a non-crystalline substrate such as glass or the like. Because a growth of vertical semiconductor elements 200 is generally performed at a high temperature, a substrate 100 stable at a high temperature is desirable.

A surface of the substrate 100 may be coated by at least one selected from an underlayer 110, a buffer layer 120, and a mask layer 130. These layers may control or facilitate the growth of the vertical semiconductor elements 200. Also, the vertical semiconductor elements 200 may be directly grown on the surface of the substrate 100.

The underlayer 110 may be, for example, a metal layer. Specifically, the underlayer 110 may include, for example, at least one of titanium (Ti), hafnium (Hf), zirconium (Zr), and aluminum (Al). The buffer layer 120 may be formed more easily on a substrate 100 coated with an underlayer than a substrate 100 not coated with an underlayer.

The buffer layer 120 may be, for example, a group III-V compound semiconductor. Specifically, the buffer layer 120 may be, for example, a GaN-based semiconductor, an AlN-based semiconductor, or a combination thereof. Specifically, the buffer layer 120 may include, for example, at least one of GaN, AN, InGaN, AlGaN, and AlInGaN. The buffer layer 120 may be a single layer. Alternatively, the buffer layer 120 may be, for example, multi-layered such as double layered and triple layered. The buffer layer 120 may be formed at a low temperature between about 450° C. to about 650° C. For example, when the buffer layer 120 is formed as GaN at a low temperature, the buffer layer 120 may be referred to as a low-temperature (LT)-GaN. Also, when the buffer layer 120 is formed as AIN at a low temperature, the buffer layer 120 may be referred to as an LT-AIN. When the buffer layer 120 is formed on a surface of the underlayer 110, the buffer layer 120 may have a preferred orientation in a vertical direction to the surface of the underlayer 110 due to a preferred orientation of the underlayer 110. The buffer layer 120 may be patterned or not patterned. An arrangement pattern of the vertical semiconductor elements 200 may be decided according to a pattern of the buffer layer 120. When the buffer layer 120 is patterned, a mask layer 130 may not be needed in deciding the arrangement pattern of the vertical semiconductor elements 200.

The mask layer 130 may be, for example, silicon oxide, silicon nitride, or a combination thereof. The mask layer 130 has at least one opening exposing the buffer layer 120. The opening may have a shape of, for example, a hole. A diameter of the opening may be, for example, about few nm to about few μm. The mask layer 130 may be a single layer or a multi-layered structure. A thickness of the mask layer 130 may be, for example, about 10 nm to about 500 nm, specifically, about 10 nm to about 200 nm. An arrangement pattern of the vertical semiconductor elements 200 may be decided according to an arrangement of the openings of the mask layer 130.

The vertical semiconductor elements 200 may be, for example, grown on regions of the buffer layer 120 which are exposed to the openings of the mask layer 130. The term "vertical semiconductor device 200" as used herein refers to a semiconductor element having a thickness in a vertical direction with respect to a surface of the substrate 100. A shape of a longitudinal section or a cross-section may be any shape. For example, the vertical semiconductor element 200 may have, for example, a pyramid shape, a rod shape, or a similar shape thereof. The vertical semiconductor elements 200 may be a single layer structure in a vertical direction or a multi-layered structure in a vertical direction. The vertical semiconductor elements 200 may have, for example, a group III-V compound semiconductor. In greater detail, the vertical semiconductor elements 200 may be, for example, a GaN-based semiconductor. Such a GaN-based semiconductor may include, for example, at least one of GaN, InGaN, AlGaN, and AlInGaN. At least some of the vertical semiconductor elements 200 may be, for example, formed at a high temperature in a range of about 900° C. to about 1100° C. For example, when some of the vertical semiconductor elements 200 are formed as GaN at a high temperature, the GaN may be referred to as a high temperature (HT)-GaN. At least some of the vertical semiconductor elements 200 may include the HT-GaN or a material based on the HT-GaN. The vertical semiconductor elements 200 may have a preferred orientation as the vertical semiconductor elements 200 grow from the surface of the buffer layer 120. The vertical semiconductor elements 200 may have excellent crystallinity.

Forming the underlayer 110, the buffer layer 120, the mask layer 130, or the vertical semiconductor elements 200 on the substrate 100 may be performed by, for example, atomic layer deposition, chemical vapor deposition, or sputtering.

Figure 1B:
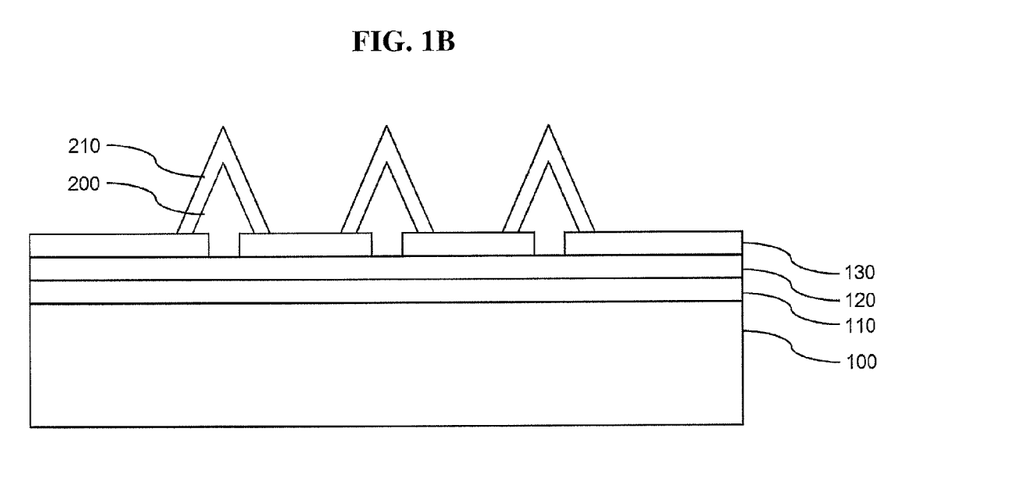

FIG. 1B illustrates an inorganic insulating layer 210 formed on a surface of the vertical semiconductor elements 200. The inorganic insulating layer 210 may be, for example, SiO2. Forming the inorganic insulating layer 210 may be performed by, for example, atomic layer deposition, chemical vapor deposition, or sputtering. After forming the inorganic insulating layer 210, a sufficient amount of —OH groups may be attached to a surface of the inorganic insulating layer 210 by treating the inorganic barrier 210 with plasma or a strong acid.

Figure 1C:
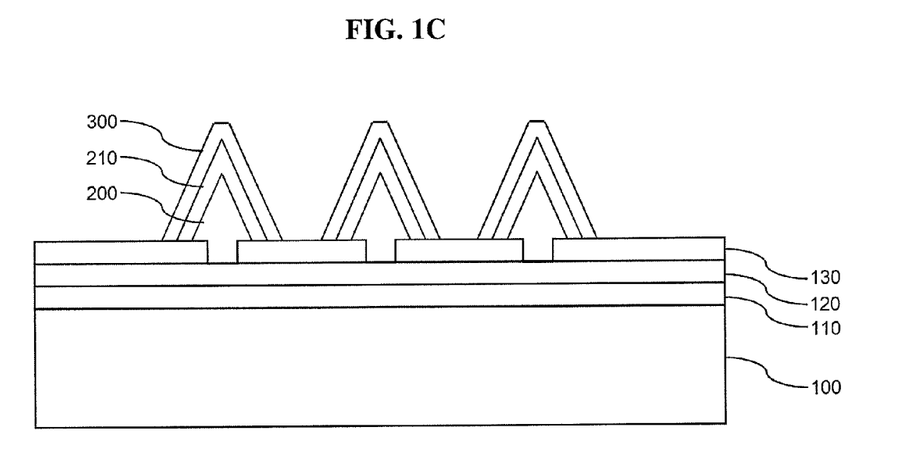

FIG. 1C illustrates an amphipathic layer 300 formed on a surface of the inorganic insulating layer 210 formed on the surface of the vertical semiconductor elements 200. The amphipathic layer 300 comprises an amphipathic material. The amphipathic material refers to a material having both a hydrolizable group and an organofunctional group. The hydrolizable group may be, for example, a methoxysilyl group. The organofunctional group may be, for example, an epoxide group. The amphipathic material having the hydrolizable group and the organofunctional group may be, for example, a silane coupling agent. The silane coupling agent may be, for example, a 3-glycidoxypropyltrimethoxysilane (3-GPTS). The 3-GPTS, has a methoxysilyl as the hydrolizable group, and an epoxide group as the organofunctional group. The amphipathic layer 300 may be formed by, for example, coating a solution including an amphipathic material on the surface of the vertical semiconductor elements 200 and removing a solvent. Coating the solution including the amphipathic material may be performed by, for example, spin coating or spray coating. The hydrolizable group of the amphipathic layer 300 may bond to an OH group on a surface of the inorganic barrier 210 by a hydrolytic condensation reaction. Accordingly, the amphipathic layer 300 and the inorganic insulating layer 210 may strongly bond to each other.

Figure 1D:
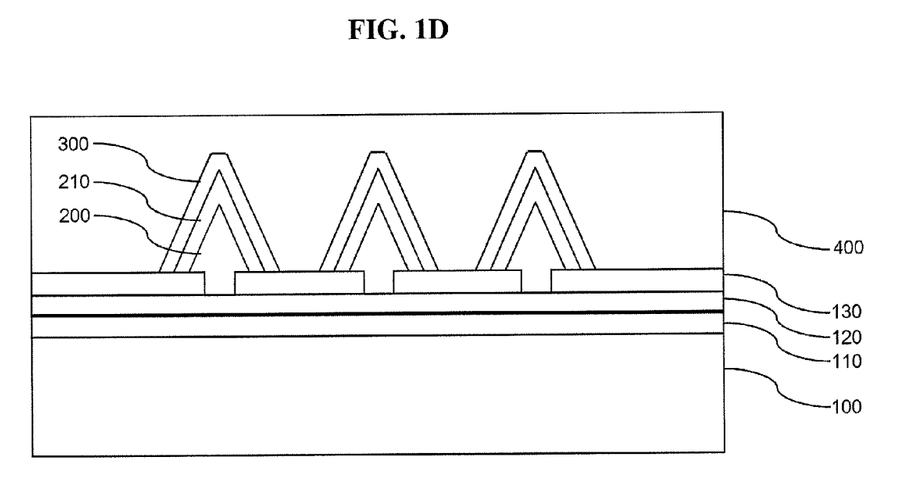

FIG. 1D illustrates a polymerizable composition layer 400 applied onto the vertical semiconductor elements 200 coated with the inorganic insulating layer 210 and the amphipathic layer 300. The polymerizable composition may be, for example, a composition including a polymerizable monomer; a reactive diluent; and an initiator. Herein, the polymerizable monomer includes a polymerizable monomer, a polymerizable oligomer, a polymerizable macromonomer, or the like. The polymerizable monomer may be, for example, urethane acrylate. The reactive diluents may be, for example, 2-hydroxypropyl-acrylate (2-HPA). The initiator may be, for example, a thermoinitiator, a photoinitiator, or a combination thereof. The photoinitiator may be 1-hydroxycyclohexyl phenyl ketone. The polymerizable composition may be, for example, commercially available. Examples of a commercially available polymerizable composition are TSV (a UV curable polymerizable composition including urethane acrylate, 2-HPA, and 1-hydroxycyclohexyl phenyl ketone) by MinutaTech, or the like. Applying the polymerizable composition may be performed by, for example, spin coating or spray coating.

Figure 1E:
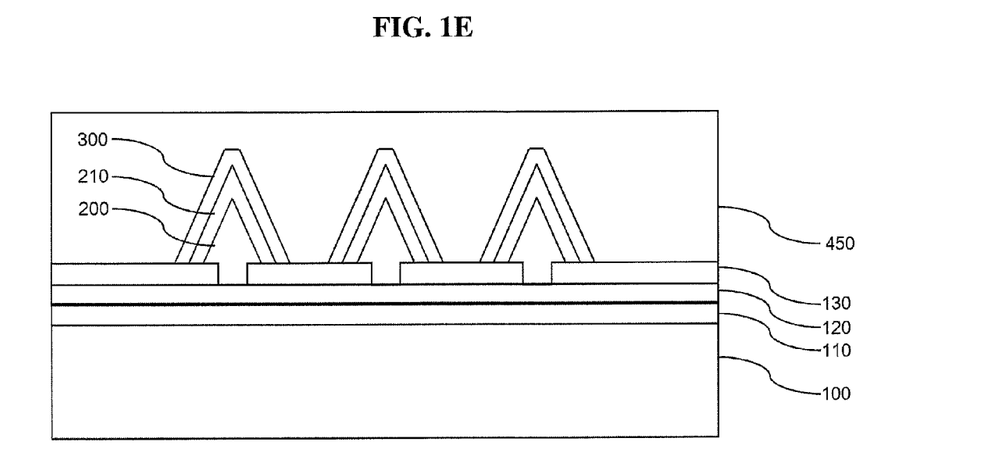

FIG. 1E illustrates the vertical semiconductor elements 200 embedded in a resin layer by transforming the coated polymerizable composition layer 400 into a resin layer 450 by curing the polymerizable composition layer 400. Curing the polymerizable composition layer 400 may be performed by, for example, applying heat or light to the polymerizable composition layer 400. When the polymerizable composition layer 400 includes a thermoinitiator, the polymerizable composite layer 400 may be cured by applying heat to the polymerizable composition layer 400. When the polymerizable composition layer 400 includes a photoinitiator, the polymerizable composition layer 400 may be cured by applying light (for example, UV rays, in greater detail, UV rays having a wavelength of about 365 nm) to the polymerizable composition layer 400. A temperature of heat curing or a wavelength of light curing may vary according to the thermoinitiator used or the photoinitiator used. During the curing process, a polymerization reaction of the polymerizable monomers of the polymerizable composition occurs and a bonding between the polymerizable monomer of the polymerizable composition and the organofunctional group of the amphipathic layer 300 occurs. Accordingly, the cured resin layer 450 and the vertical semiconductor elements 200 strongly bond to each other by having the inorganic insulating layer 210 and the amphipathic layer 300 as a medium. A bonding strength between the cured resin layer 450 and the vertical semiconductor elements 200 is stronger than a bonding strength between the substrate 100 and the vertical semiconductor elements 200. The bonding strength between the cured resin layer 450 and the vertical semiconductor elements 200 is stronger than a bonding strength between the substrate 100 and the underlayer 110. The bonding strength between the cured resin layer 450 and the vertical semiconductor elements 200 is stronger than a bonding strength between the substrate 100 and the buffer layer 120.

Figure 1F:
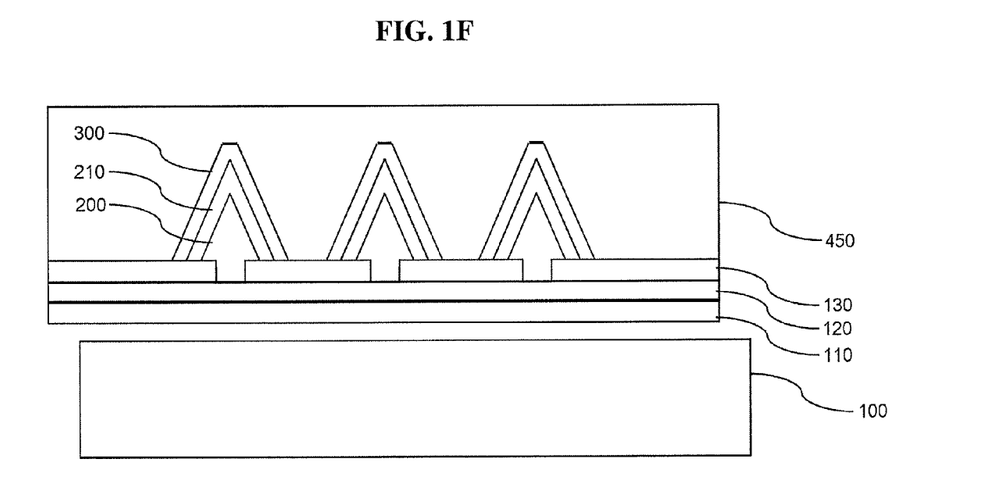

FIG. 1F illustrates separating the resin layer 450 along with the vertical semiconductor elements 200 from the substrate 100. When the resin layer 450 is stripped off from the substrate 100, the semiconductor elements 200 separate as embedded in the resin layer 450 because of a strong bonding strength between the cured resin layer 450 and the vertical semiconductor elements 200. When the underlayer 110, the buffer layer 120, and/or the mask layer 130 are formed between the vertical semiconductor elements 200 and the substrate 100, the underlayer 110, the buffer layer 120, and/or the mask layer 130 may be separated from the substrate 100 as coupled to the vertical semiconductor elements 200.

Figure 1G:
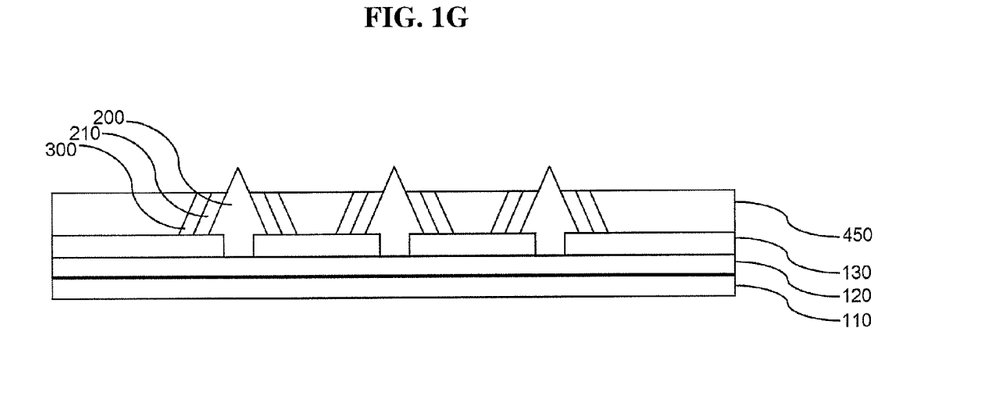

FIG. 1G illustrates the vertical semiconductor elements 200 having an upper portion exposed due to an etching of the resin layer 450. The etching of the resin layer 450 may be performed by using, for example, an etching gas including CF4 and O2. Through the etching of the resin layer 450, the upper portion of the vertical semiconductor elements 200 may be exposed to the exterior. For example, about ⅕ to about ½ of the upper portion of a vertical length of the vertical semiconductor elements 200 may be exposed externally. In another embodiment, exposing an upper portion of the vertical semiconductor elements 200 by etching the resin layer 450 may be performed before separating the resin layer 450 along with the vertical semiconductor elements 200 from the substrate 100.

Through a process illustrated in FIGS. 1A to 1G, the vertical semiconductor elements 200 grown or formed on the substrate 100 may be efficiently transferred to the resin layer 450 while maintaining an arrangement of the semiconductor elements 200. Furthermore, the resin layer 450 may act as a flexible substrate supporting the vertical semiconductor elements 200.

Hereinafter, a second embodiment of a method of transferring semiconductor elements will be described in detail with reference to FIGS. 2A to 2D. FIGS. 2A to 2D are cross-sectional views illustrating the second embodiment of a method of transferring semiconductor elements.

Figure 2A:
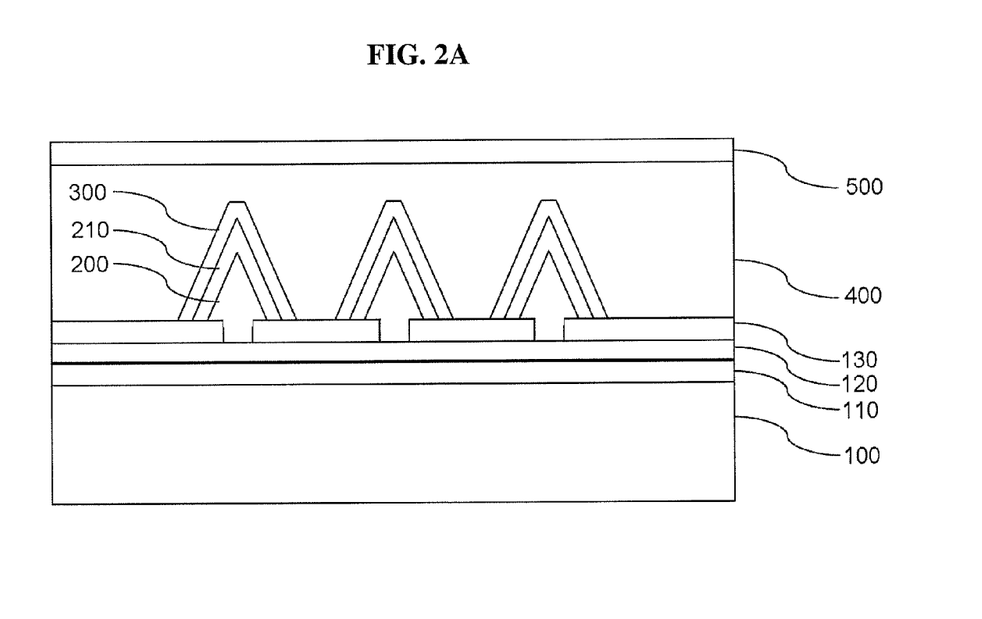
FIG. 2A to 2D are cross-sectional views illustrating another exemplary embodiment of a method of transferring semiconductor elements.

In a second exemplary embodiment, forming the vertical semiconductor elements 200 on the substrate; forming the inorganic insulating layer 210 on the surface of the vertical semiconductor elements 200, and attaching OH groups on the surface of the inorganic insulating layer 210; forming the amphipathic layer 300 on the surface of the inorganic insulating layer 210; and, applying the polymerizable composition 400 on the vertical semiconductor elements 200 coated with the amphipathic layer 300; are the same as in the above-described first exemplary embodiment.

FIG. 2A illustrates compressing a support layer 500 on the applied polymerizable composition layer 400. The support layer 500 may be, for example, polyethylene terephthalate film or the like.

In the second exemplary embodiment, one surface of the support layer 500 contacting the applied polymerizable composition 400 may be coated with an adhesion promoter. The adhesion promoter may increase the bonding strength between the resin layer 450 formed by curing the coated polymerizable composition 400 and the support layer 500. The adhesion promoter may be suitably selected according to a material for the support layer 500 and to a material for the resin layer 450. In the second exemplary embodiment, one surface of the support layer 500 contacting the coated polymerizable composition 400 may be coated with an adhesion preventer. The adhesion preventer prevents the bonding strength between the resin layer 450 formed by curing the coated polymerizable composition 400 and the support layer 500 from becoming too strong, making a separation of the resin layer 450 and the support layer 500 easy. Examples of the adhesion preventer may include urethane acrylate resin or the like.

By compressing the support layer 500 on the coated polymerizable composition 400, the support layer 500 may be located very close to the vertical semiconductor elements 200. Here, the coated polymerizable composition gets squeezed, thereby minimizing the amount of polymerizable composition 400 on the vertical semiconductor elements 200. Accordingly, the amount of the resin layer 450 that needs to be removed by etching may be minimized as well. Accordingly, the economic feasibility of etching the resin layer 450 may be improved.

Figure 2B:
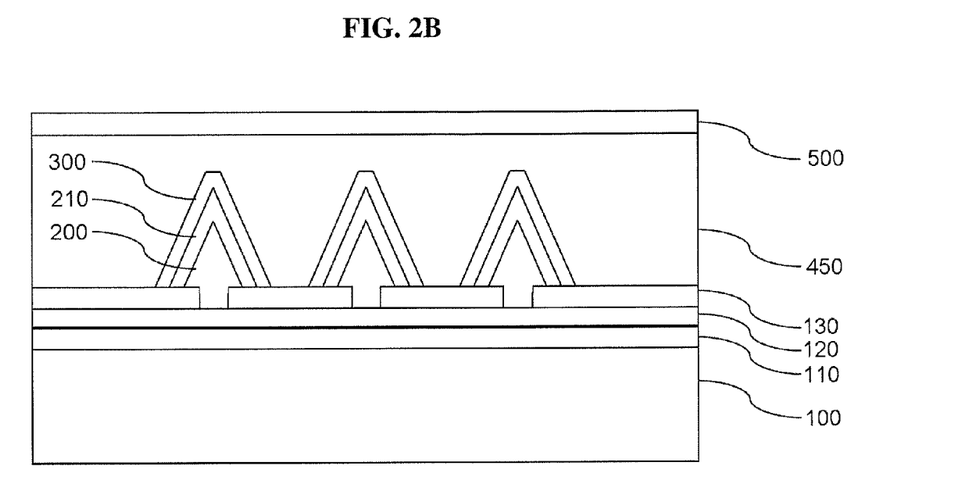

FIG. 2B illustrates the vertical semiconductor elements 200 embedded in a resin layer by transforming the coated polymerizable composition layer 400 into a resin layer 450 by curing the polymerizable composition layer 400. Curing the polymerizable composition layer 400 may be performed by, for example, applying heat or light to the polymerizable composition layer 400. When the polymerizable composition layer 400 includes a thermoinitiator, the polymerizable composition layer 400 may be cured by applying heat to the polymerizable composition layer 400. When the polymerizable composition layer 400 includes a photoinitiator, the polymerizable composition layer 400 may be cured by applying light (for example, UV rays, in greater detail, UV rays having a wavelength of about 365 nm) to the polymerizable composition layer 400. A temperature of heat curing or a wavelength of light curing may vary according to the thermoinitiator used or the photoinitiator used. During the curing process, a polymerization reaction of the polymerizable monomers of the polymerizable composite; and a bonding between the polymerizable monomer of the polymerizable composition and the support layer 500 occur. As mentioned above, a bonding strength between the polymerizable monomer of the polymerizable composition and the support layer 500 may be controlled by the adhesion promoter or the adhesion preventer coated on a surface of the support layer 500 as needed.

The cured resin layer 450 and the vertical semiconductor elements 200 strongly bond to each other by having the inorganic insulating layer 210 and the amphipathic layer 300 as a medium. A bonding strength between the cured resin layer 450 and the vertical semiconductor elements 200 is stronger than the bonding strength between the substrate 100 and the vertical semiconductor elements 200. The bonding strength between the cured resin layer 450 and the vertical semiconductor elements 200 is stronger than the bonding strength between the substrate 100 and the underlayer 110. The bonding strength between the cured resin layer 450 and the vertical semiconductor elements 200 is stronger than the bonding strength between the substrate 100 and the buffer layer 120.

A bonding strength between the cured resin layer 450 and the support layer 500 is stronger than the bonding strength between the substrate 100 and the vertical semiconductor elements 200. A bonding strength between the cured resin layer 450 and the support layer 500 is stronger than the bonding strength between the substrate 100 and the underlayer 110. A bonding strength between the cured resin layer 450 and the support layer 500 is stronger than the bonding strength between the substrate 100 and the buffer layer 120.

Figure 2C:
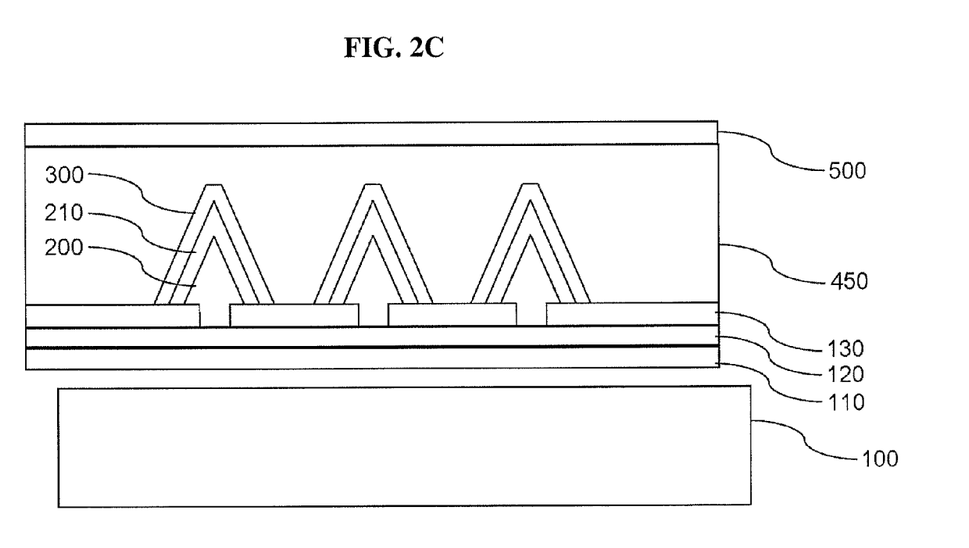

FIG. 2C illustrates separating the support layer 500 along with the resin layer 450 and the vertical semiconductor elements 200 from the substrate 100. When the support layer 500 is stripped off from the substrate 100, the semiconductor elements 200 as well as the resin layer 450 get separated from the substrate 100, and supported on the support layer 500, because a bonding strength between the support layer 500 and the resin layer 450 is strong and a bonding strength between the resin layer 450 and the vertical semiconductor elements 200 is strong. When the underlayer 110, the buffer layer 120, and/or the mask layer 130 are formed between the vertical semiconductor elements 200 and the substrate 100, the underlayer 110, the buffer layer 120, and/or the mask layer 130 may be separated from the substrate 100 as coupled to the vertical semiconductor elements 200. Because the strength of the resin layer 450 is reinforced by a support from the support layer 500, damage on the resin layer 450 during the separation from the substrate 100 may be prevented. Accordingly, employing the support layer 500 is particularly advantageous when manufacturing a large area semiconductor device.

Figure 2D:
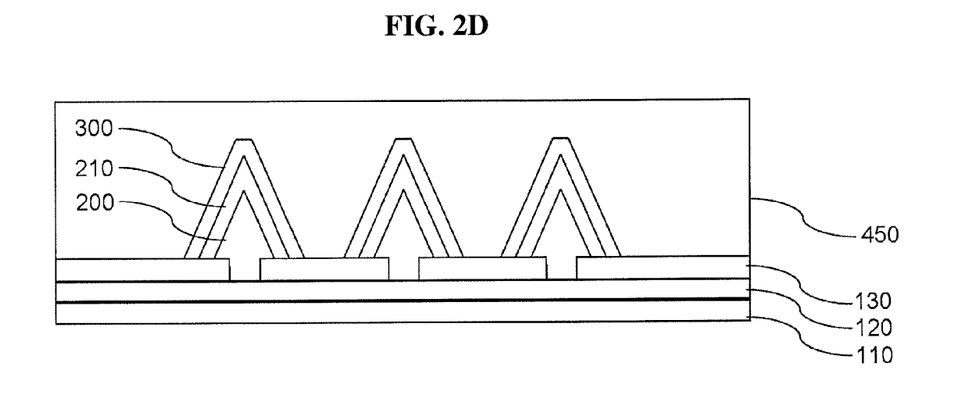
Figure 3:
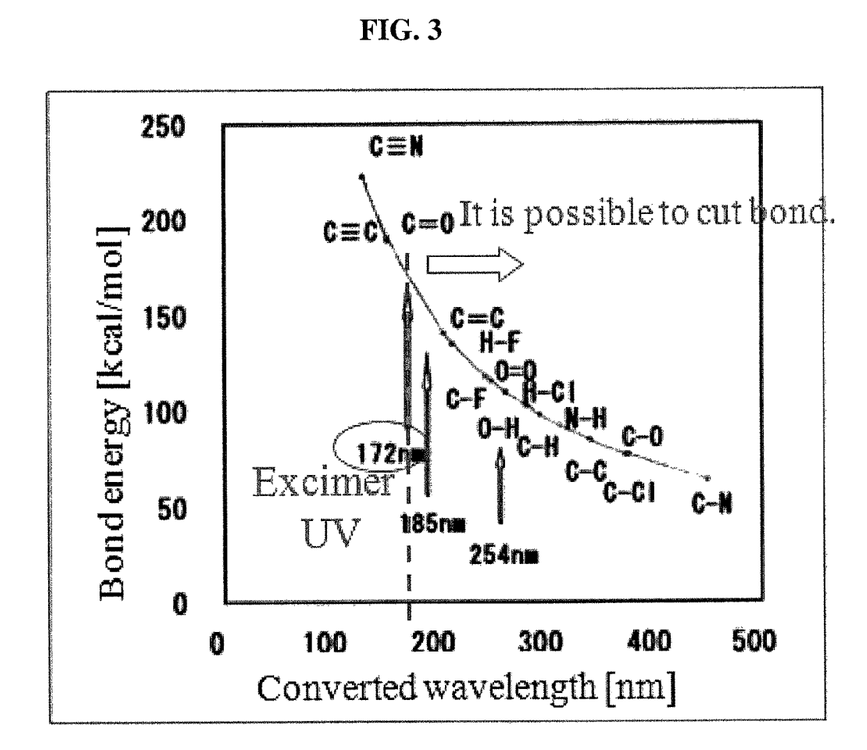
FIG. 3 is a graph showing a relationship between various types of bonds and corresponding wavelengths for breaking the bonds.

FIG. 2D illustrates the resin layer 450 after removing the support layer 500. Removing the support layer 500 may be performed by, for example, an etching. Etching the support layer 500 may be performed by, for example, using an etching gas including CF4 and O2. Removing the support layer 500 may be performed by, for example, destroying a bond between the support layer 500 and the resin layer 450 through a photolysis process. In greater detail, for example, a laminate, including the support layer 500, the resin layer 450, and the vertical semiconductor elements 200 separated from the substrate 100, is placed on a dummy substrate, a bond between the support layer 500 and the resin layer 450 is destroyed by applying a wavelength for destroying a molecular bond to the support layer 500. As a result, adhesion between the support layer 500 and the resin layer 450 becomes weaker than adhesion between the dummy substrate and the vertical semiconductor elements 200. Accordingly, the support layer 500 may be easily removed by stripping off the support layer 500. The wavelength for destroying a molecular bond may be a wavelength corresponding to a bonding energy of various types of bonding. The various types of bonding and the wavelength for destroying a molecular bond corresponding to the same are illustrated in FIG. 3. For example, by using a wavelength of about 172 nm, most chemical bonds having a bonding energy below C=C bond were destroyed.

In the second exemplary embodiment, the exposing of the upper portion of the vertical semiconductor elements 200 by etching a portion of the resin layer 450 is the same as in the first exemplary embodiment.

Through processes illustrated in FIGS. 2A to 2D, the vertical semiconductor elements 200 grown or formed on the substrate 100 may be efficiently transferred to the resin layer 450 while maintaining an arrangement of the semiconductor elements 200. Furthermore, the resin layer 450 may act as a flexible substrate supporting the vertical semiconductor elements 200. The embodiments of FIGS. 2A to 2D are particularly advantageous when manufacturing a flexible semiconductor device having a large area, due to employing a support layer.

Hereinafter, an exemplary embodiment of manufacturing a flexible semiconductor device will be described in detail. An exemplary embodiment of a method of manufacturing a flexible semiconductor device according to another aspect includes: preparing a flexible laminate including a resin layer, vertical semiconductor elements embedded in the resin layer, wherein upper portions of the semiconductor elements are exposed above the resin layer, and bottom portions of the semiconductor elements are exposed below the resin layer. Additionally, at least one of a mask layer, a buffer layer, and an underlayer may be provided below the vertical semiconductor elements. The method further includes forming an upper electrode electrically connected to the vertical semiconductor elements on an upper surface of the flexible laminate, and forming a bottom electrode electrically connected to the vertical semiconductor elements on a bottom surface of the flexible laminate.

The flexible laminate including the resin layer, the vertical semiconductor elements, the mask layer, the buffer layer, and the underlayer located below the vertical semiconductor elements may be prepared according to exemplary embodiments as described above.

At least one of the upper electrode and the bottom electrode may be a transparent electrode. Both of the upper electrode and the bottom electrode may be transparent electrodes. The transparent electrode may be formed by, for example, graphene, or transparent conductive oxide (TCO) such as indium tin oxide (ITO). One of the upper electrode and the bottom electrode may be a transparent electrode, and the other electrode may be a non-transparent electrode. The non-transparent electrode may be formed by, for example, gold (Au), palladium (Pd), aluminum (Al), platinum (Pt), silver (Ag), titanium (Ti), and a combination thereof. However, materials for the upper electrode and the bottom electrode described here in detail are for illustrative purposes only, and various other materials may be used as the materials for the upper electrode and the bottom electrode.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of transferring semiconductor elements, the method comprising:
   forming a plurality of vertical semiconductor elements on a substrate;
   forming an inorganic insulating layer on a surface of each of the plurality of vertical semiconductor elements and attaching an OH group on a surface of the inorganic insulating layer;
   forming an amphipathic layer on the surface of the inorganic insulating layer;
   applying a polymerizable composition on top of the plurality of vertical semiconductor elements coated with the amphipathic layer;
   curing the applied polymerizable composition thereby converting the applied polymerizable composition into a resin layer such that the plurality of vertical semiconductor elements are embedded in the resin layer;
   separating the resin layer along with the plurality of vertical semiconductor elements from the substrate; and
   etching a portion of the resin layer such that an upper portion of each of the plurality of vertical semiconductor elements is exposed.

2. The method of claim 1, wherein the substrate is a crystalline substrate.

3. The method of claim 1, wherein the substrate is an amorphous substrate.

4. The method of claim 1, wherein a surface of the substrate is coated by at least one of an underlayer, a buffer layer, and a mask layer, and the plurality of vertical semiconductor elements are formed on the at least one of the underlayer, the buffer layer, and the mask layer.

5. The method of claim 4, wherein the surface of the substrate is coated by the underlayer comprising at least one of titanium, hafnium, zirconium, and aluminum.

6. The method of claim 4, wherein the surface of the substrate is coated by the buffer layer, and the buffer layer is a group III-V compound semiconductor.

7. The method of claim 4, wherein surface of the substrate is coated by the buffer layer comprising one of a GaN-based semiconductor, an AlN-based semiconductor, and a combination thereof.

8. The method of claim 4, wherein the surface of the substrate is coated by the buffer layer comprising at least one of GaN, AN, InGaN, AlGaN, and AlInGaN.

9. The method of claim 4, wherein, the surface of the substrate is coated by the buffer layer, and the method further comprises patterning the buffer layer.

10. The method of claim 4, wherein the surface of the substrate is coated by the mask layer, and a thickness of the mask layer is about 10 nm to about 500 nm.

11. The method of claim 4, wherein the surface of the substrate is coated by the mask layer, and a thickness of the mask layer is about 10 nm to about 200 nm.

12. The method of claim 1, wherein the plurality of vertical semiconductor elements each have one of a pyramid shape and a rod shape.

13. The method of claim 1, wherein the plurality of vertical semiconductor elements comprise a group III-V compound semiconductor.

14. The method of claim 1, wherein the plurality of vertical semiconductor elements are a GaN-based semiconductor.

15. The method of claim 1, wherein the plurality of vertical semiconductor elements comprise at least one of GaN, InGaN, AlGaN, and AlInGaN.

16. The method of claim 1, wherein the inorganic insulating layer is $SiO_2$.

17. The method of claim 1, wherein the inorganic insulating layer is treated with plasma or a strong acid.

18. The method of claim 1, wherein the amphipathic layer has a methoxysilyl group as a hydrolizable group.

19. The method of claim 1, wherein the amphipathic layer has an epoxide group as an organofunctional group.

20. The method of claim 1, wherein the amphipathic layer comprises a silane coupling agent.

21. The method of claim 1, wherein the amphipathic layer comprises a 3-glycidoxypropyltrimethoxysilane.

22. The method of claim 1, wherein the polymerizable composition comprises a polymerizable monomer; a reactive diluent; and an initiator.

23. The method of claim 22, wherein the polymerizable monomer is urethane acrylate.

24. The method of claim 22, wherein the reactant diluent is 2-hydroxypropyl-acrylate.

25. The method of claim 22, wherein the initiator is 1-hydroxycyclohexyl phenyl ketone.

26. The method of claim 1, wherein a bonding strength between the cured resin layer and the plurality of vertical semiconductor elements is stronger than a bonding strength between the substrate and the plurality of vertical semiconductor elements.

27. The method of claim 1, wherein the etching the resin layer comprises using an etching gas including $CF_4$ and $O_2$.

28. The method of claim 1, wherein etching the resin layer thereby exposing an upper portion of the vertical semiconductor elements is performed before separating the resin layer along with the vertical semiconductor elements from the substrate.

* * * * *